(12) United States Patent
Lee

(10) Patent No.: US 9,324,770 B2
(45) Date of Patent: Apr. 26, 2016

(54) ORGANIC LIGHT EMITTING DISPLAY DEVICES AND METHODS OF MANUFACTURING ORGANIC LIGHT EMITTING DISPLAY DEVICES

(71) Applicant: SAMSUNG DISPLAY CO., LTD., Yongin, Gyeonggi-Do (KR)

(72) Inventor: Hee-Chul Lee, Cheonan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/337,330

(22) Filed: Jul. 22, 2014

(65) Prior Publication Data

US 2015/0084015 A1    Mar. 26, 2015

(30) Foreign Application Priority Data

Sep. 24, 2013    (KR) .......................... 10-2013-0112979

(51) Int. Cl.
| | |
|---|---|
| *H01L 29/08* | (2006.01) |
| *H01L 27/32* | (2006.01) |
| *H01L 51/05* | (2006.01) |
| *H01L 51/00* | (2006.01) |
| *B82Y 10/00* | (2011.01) |

(52) U.S. Cl.
CPC ............. *H01L 27/3227* (2013.01); *B82Y 10/00* (2013.01); *H01L 51/0036* (2013.01); *H01L 51/0545* (2013.01)

(58) Field of Classification Search
CPC ............ H01L 27/3227; H01L 51/0545; H01L 51/0036; B82Y 10/00
USPC .................. 257/40, 84; 345/174; 359/290
See application file for complete search history.

(56) References Cited

U.S. PATENT DOCUMENTS

| | | | | |
|---|---|---|---|---|
| 8,907,324 | B2 * | 12/2014 | Park et al. | ........................ 257/40 |
| 2009/0103165 | A1 * | 4/2009 | Kothari et al. | ................. 359/290 |
| 2011/0279399 | A1 * | 11/2011 | Anderson et al. | ............. 345/174 |
| 2012/0326131 | A1 * | 12/2012 | Han | ................................ 257/40 |
| 2013/0122638 | A1 |  5/2013 | Jones-Albertus et al. | |
| 2015/0034911 | A1 * |  2/2015 | Liu et al. | ......................... 257/40 |

FOREIGN PATENT DOCUMENTS

| | | |
|---|---|---|
| KR | 10-2005-0035595 A | 4/2005 |
| KR | 10-2001-0064410 A | 6/2011 |
| KR | 10-2011-0061442 A | 6/2011 |

\* cited by examiner

*Primary Examiner* — Mohammed Shamsuzzaman
(74) *Attorney, Agent, or Firm* — Lee & Morse, P.C.

(57) ABSTRACT

An organic light emitting display device includes a first substrate having a display region and a peripheral region adjacent to the display region, a plurality of display structures in the display region, the display structures including a plurality of switching elements and a plurality of organic light emitting elements, a plurality of solar cells adjacent to the organic light emitting elements in the display region, and a second substrate opposed to the first substrate.

7 Claims, 10 Drawing Sheets

ORGANIC LIGHT EMITTING DISPLAY DEVICES AND METHODS OF MANUFACTURING ORGANIC LIGHT EMITTING DISPLAY DEVICES

CROSS-REFERENCE TO RELATED APPLICATION

Korean Patent Application No. 10-2013-0112979, filed on Sep. 24, 2013, in the Korean Intellectual Property Office, and entitled: "Organic Light Emitting Display Devices and Methods Of Manufacturing Organic Light Emitting Display Devices," is incorporated by reference herein in its entirety.

BACKGROUND

1. Field

Embodiments relate to organic light emitting display (OLED) devices and method of manufacturing the organic light emitting display devices.

2. Description of the Related Art

An organic light emitting display (OLED) device displays information such as images, letters, and/or characters using light generated by combination of holes provided from an anode and electrons provided from a cathode in an organic layer. The organic light emitting display device has several advantages such as relatively a large viewing angle, a rapid response speed, a small thickness, low power consumption, etc. Accordingly, the organic light emitting display device has become a prospective next-generation display device. The organic light emitting display device may generally include a first substrate having a display region and a peripheral region adjacent to the display region, a display structure, a second substrate, etc.

SUMMARY

Embodiments are directed to an organic light emitting display device including a first substrate having a display region and a peripheral region adjacent to the display region, a plurality of display structures in the display region, the display structures including a plurality of switching elements and a plurality of organic light emitting elements, a plurality of solar cells adjacent to the organic light emitting elements in the display region, and a second substrate opposed to the first substrate.

One solar cell may be located between two adjacent organic light emitting elements.

The number of organic light emitting elements may be the same as the number of the solar cells.

One solar cell may be located among three or more adjacent organic light emitting elements.

Each of the solar cells may include a first solar cell pattern having an n-type semiconductor, and a second solar cell pattern having a p-type semiconductor. A p-n junction between the first solar cell pattern and the second solar cell pattern may convert at least one of light incident from an outside and light emitted from the organic light emitting elements into electric energy.

Each of the solar cells may have a sheet shape.

Each of the solar cells may provide holes or electrons to a first electrode of an adjacent organic light emitting element or a second electrode of the adjacent organic light emitting element.

Each of the solar cells may provide holes to a first electrode of one adjacent organic light emitting element or a second electrode of one adjacent organic light emitting element, and may provide electrons to a first electrode of an other adjacent organic light emitting element or a second electrode of the other adjacent organic light emitting element.

Each of the solar cells may include at least one selected from the group of an organic thin film solar cell, a compound semiconductor solar cell, and a dye-sensitized solar cell.

Each of the switching elements may include channels having the same conductivity type.

Embodiments are also directed to an organic light emitting display device including a first substrate having a display region and a peripheral region adjacent to the display region, a plurality of display structures in the display region, the display structures including a plurality of switching elements having channels with different conductivity types and a plurality of organic light emitting elements, and a second substrate opposed to the first substrate.

Each of the display structures may include a first switching element on the first substrate and a second switching element on the first switching element.

The first switching element may include an n-type transistor. The second switching element may include a p-type transistor.

A p-n junction between the first switching element and the second switching element may act as an internal power source of the organic light emitting display device.

The p-n junction may convert at least one of light incident from an outside and light emitted from the organic light emitting elements to an electric energy.

Embodiments are also directed to an organic light emitting display device including a first substrate having a display region and a peripheral region adjacent to the display region, a plurality of first display structures in the display region, the first display structures including switching elements and first organic light emitting elements, a plurality of second display structures in the display region, the second display structures including first switching elements and second switching elements that have channels of different conductivity types, and second organic light emitting elements, and a second substrate opposed to the first substrate.

The first switching elements may include n-type channel regions. The second switching elements may include p-type channel regions.

A p-n junction between the first switching element and the second switching element may act as an internal power source of the organic light emitting display device.

The p-n junction may convert at least one of light incident from an outside and light emitted from the first and the second organic light emitting elements to an electric energy.

The first display structures and the second display structures may be alternately disposed along a row direction or a column direction.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
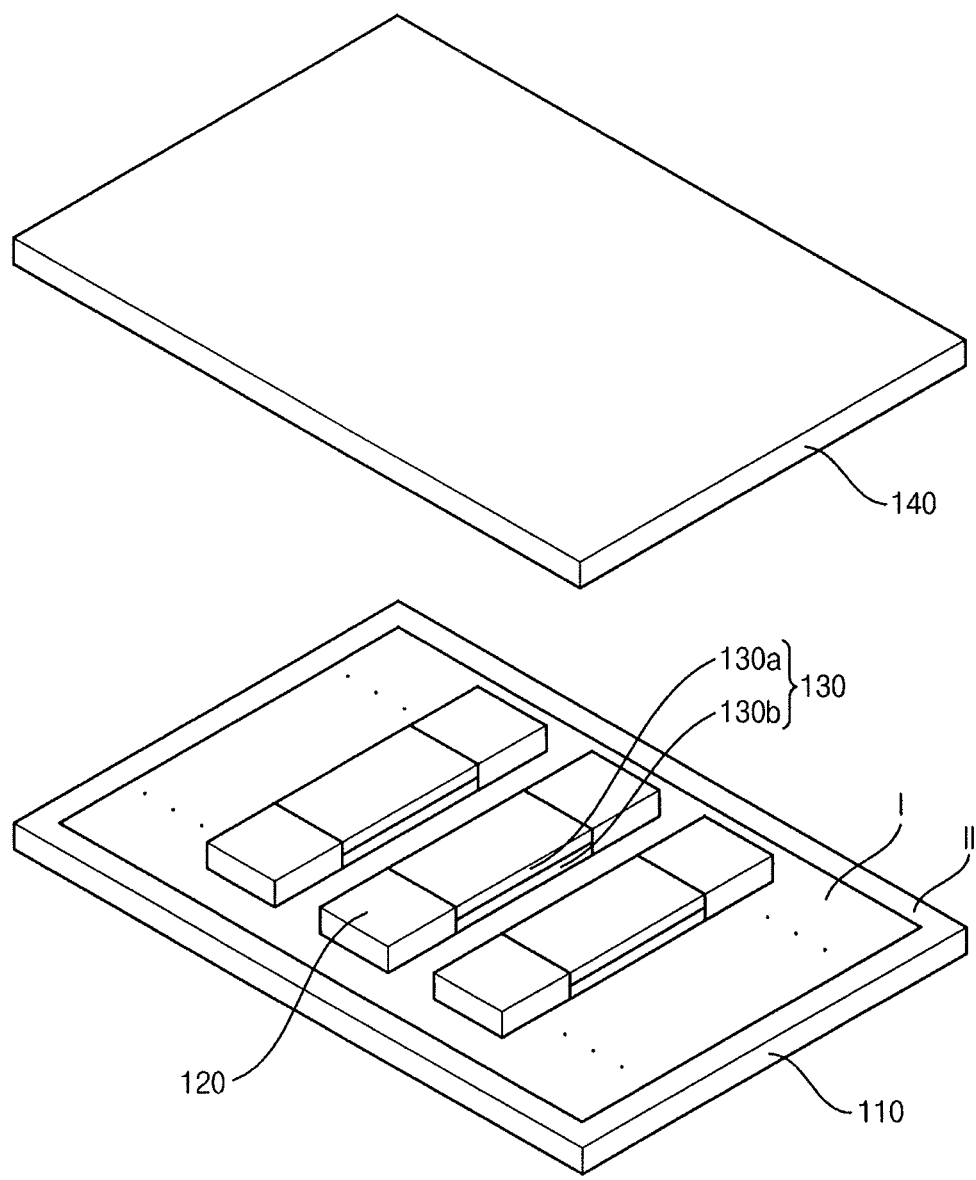
FIG. 1 illustrates an exploded perspective view depicting an organic light emitting display device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings thereof the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates an exploded perspective view depicting an organic light emitting display device in accordance with example embodiments.

Referring to FIG. 1, an organic light emitting display device 100 may include a first substrate 110, a plurality of display structures 120, a plurality of solar cells 130, a second substrate 140, etc.

The first substrate 110 may include a transparent insulation material. For example, the first substrate 110 may include a glass substrate, a quartz substrate, a transparent resin substrate, etc. Examples of the transparent resin substrate for the first substrate 110 may include a polyimide resin, an acryl resin, a polyacrylate resin, a polycarbonate resin, a polyether resin, a sulfonic acid resin, a polyethyleneterephthalate resin, etc. In example embodiments, the first substrate 110 may have a display region I and a peripheral region II adjacent to the display region I. For example, the peripheral region II may substantially surround the display region I.

The display structures 120 may be disposed in the display region I. Each of the display structures 120 may include switching elements, wirings, insulation layers, organic light emitting elements, etc. In example embodiments, the switching elements may include channels having the same conductivity type. For example, each of the switching elements may include a transistor having an n-type channel (e.g., an N-MOSFET) or a transistor having a p-type channel (e.g., a P-MOSFET).

The plurality of solar cells 130 may be disposed in the display region I of the first substrate 110. For example, the solar cells 130 may be disposed among the organic light emitting elements of the display structures 120, respectively. Each of the solar cells 130 may convert light emitted from the organic light emitting elements into electric energy. Additionally, each solar cell 130 may convert light incident from an outside into electric energy.

Figure 11:
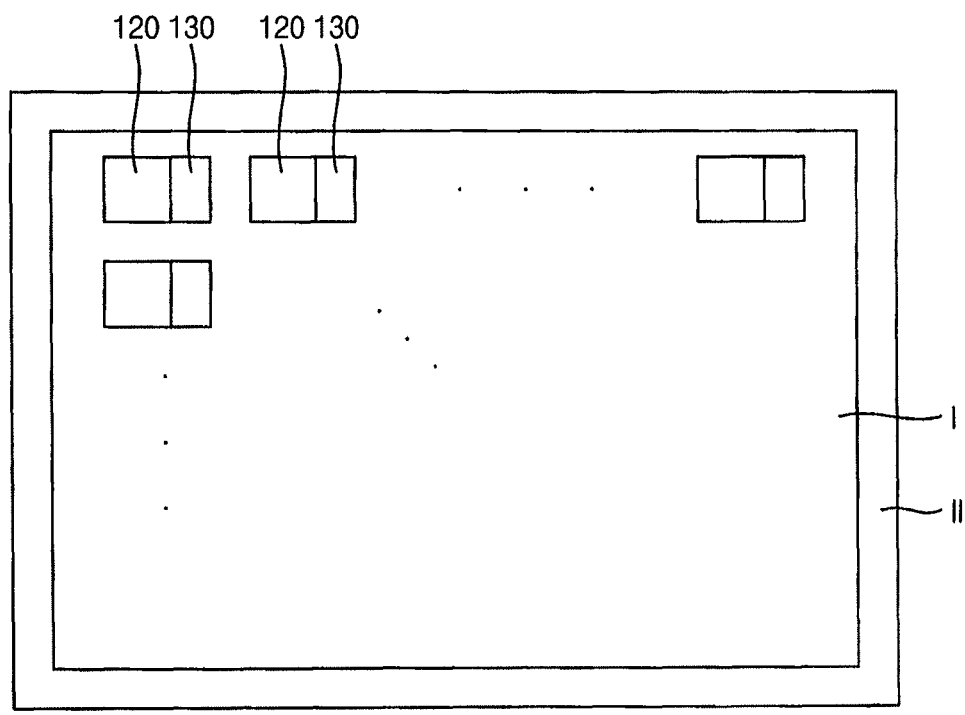
FIG. 11 schematically illustrates a plan view depicting an arrangement of solar cells and display structures on a first substrate according to an embodiment.
Figure 12:
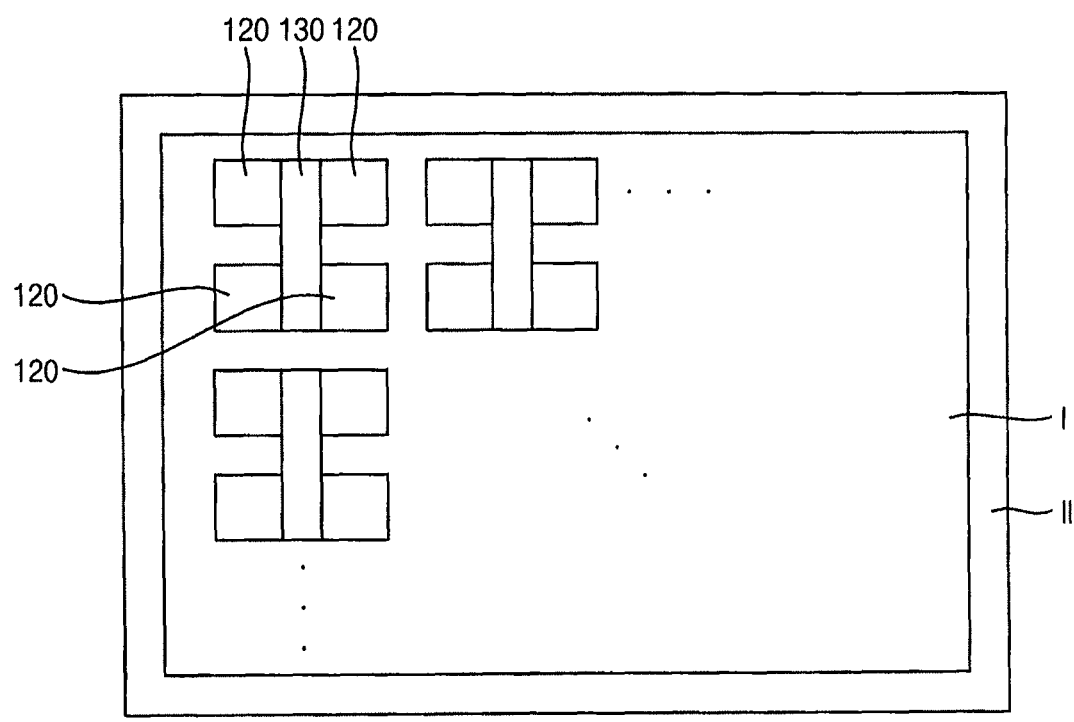
FIG. 12 schematically illustrates a plan view depicting an arrangement of solar cells and display structures on a first substrate according to an embodiment.

In example embodiments, one solar cell 130 may be disposed between two adjacent organic light emitting elements, as illustrated in FIGS. 1, 4-6, and 10. In this case, one solar cell 130 may provide electric energy (i.e., electric power) to two organic light emitting elements. In some example embodiments, one solar cell 130 may correspond to one organic light emitting element of the display structures 120. For example, the number of organic light emitting elements may be identical to the number of the solar cells 130, as illustrated in FIG. 11. Here, one solar cell 130 may provide electric energy to one organic light emitting element. In other example embodiments, one solar cell 130 may correspond to three adjacent organic light emitting elements or four adjacent organic light emitting elements, as illustrated in FIG. 12. In this case, one solar cell 130 may provide electric energy to three organic light emitting elements or four organic light emitting elements. The arrangement of the solar cells 130 in the display region I may vary in accordance with the dimensions and the types of the organic light emitting display device 100, required electric power of the organic light emitting display device 100, etc.

In example embodiments, each of the solar cells 130 may include a first solar cell pattern 130*a* and a second solar cell pattern 130*b*. Each of the first solar cell pattern 130*a* and the second solar cell pattern 130*b* may include an organic thin film solar cell, a compound semiconductor solar cell, a dye-sensitized solar cell, etc. For example, each solar cell 130 may have a sheet shape in which the first solar cell pattern 130*a* is bonded with the second solar cell pattern 130*b*.

In example embodiments, each of the solar cells 130 may include the first solar cell pattern 130*a* having a p-type semiconductor and the second solar cell pattern 130*b* having an n-type semiconductor. The second solar cell pattern 130*b* may be disposed beneath the first solar cell pattern 130*a*. Accordingly, a p-n junction may be generated between the first solar cell pattern 130*a* and the second solar cell pattern 130*b*. The p-n junction may convert a light incident from an outside and/or a light emitted from the organic light emitting elements of the display structures 120 into electric energy. For example, the converted electric energy may be used as power. The power may be provided to a first electrode of the organic light emitting element and/or a second electrode of the organic light emitting element while using an external power source. As a result, the external power source may be continuously conserved due to the use of internal power sources (i.e., the solar cells 130). Additionally, the organic light emitting display device 100 may be sequentially used without replacing the external power sources. The organic light emitting display device 100 according to example embodiments of the invention may provide lower external power consumption and an improved portability and usability.

In some example embodiments, when the solar cells 130 are located among the organic light emitting elements, the solar cells 130 may provide holes and/or electrons to the first electrodes of adjacent organic light emitting elements and/or the second electrodes of adjacent organic light emitting elements. In other example embodiments, the solar cells 130 may provide the holes to the first electrode of one adjacent organic light emitting element or the second electrode of one adjacent organic light emitting element. Additionally, the solar cells 130 may provide the holes to a first electrode of another adjacent organic light emitting element or a second electrode of another adjacent organic light emitting element. Accordingly, the organic light emitting display device 100 may autonomously utilize the electric energy without using up the electric energy provided from the external power source. Instead, the organic light emitting display device 100 may utilize the solar cells 130 as the internal power sources thereof. As a result, the organic light emitting display device 100 may have lower external power consumption. Additionally, the solar cells 130 may be disposed in portions of the display region I (i.e., portions among the organic light emitting elements in the display region I) instead in the peripheral region II having limited dimensions and shape. Therefore, the organic light emitting display device 100 may be relatively thin and may have a relatively lighter weight.

The second substrate 140 may be substantially opposed to the first substrate 110. The second substrate 140 may protect the display structures 120 from external impacts or environments. For example, the second substrate 140 may be a transparent substrate such as a glass substrate, a quartz substrate, a transparent resin substrate, etc.

A comparative organic light emitting display device operates with the electric energy provided from an external power source. The type of the external power source or the size of the external power source may be limited, and also the improvement of the power consumption thereof may also be limited. The organic light emitting display device 100 according to example embodiments, on the other hand, may include the solar cells 130. The solar cells 130 may be disposed in the display region I and may be adjacent to the organic light emitting elements. The solar cells 130 disposed in the display region I may convert the light incident from the outside to electric energy and/or may convert the light emitted from the organic light emitting elements to electric energy. The electric energy converted from the light may be provided to the first electrodes of the organic light emitting elements and/or the second electrodes of the organic light emitting elements. Therefore, the external power source may be continuously conserved by the internal power sources, for example, the solar cells 130. Additionally, the organic light emitting display device 100 may be sequentially used without replacing the external power source. The organic light emitting display device 100 may have relatively lower power consumption and improved portability and usability. Further, the solar cells 130 may provide the holes to the first electrodes of adjacent organic light emitting elements or the second electrodes of adjacent organic light emitting elements. Accordingly, the organic light emitting display device 100 may autonomously generate electric energy without an external power source. The organic light emitting display device 100 may use the solar cells 130 as the internal power sources thereof. As a result, the organic light emitting display device 100 may have relatively lower power consumption. Furthermore, the solar cells 130 may be disposed in portions among the organic light emitting elements in the display region I instead of the peripheral region II, which may have limited dimension and shape. The organic light emitting display device 100 may provide reduced dimensions, such as a relatively thin thickness, relatively light weight, etc.

Figure 2:
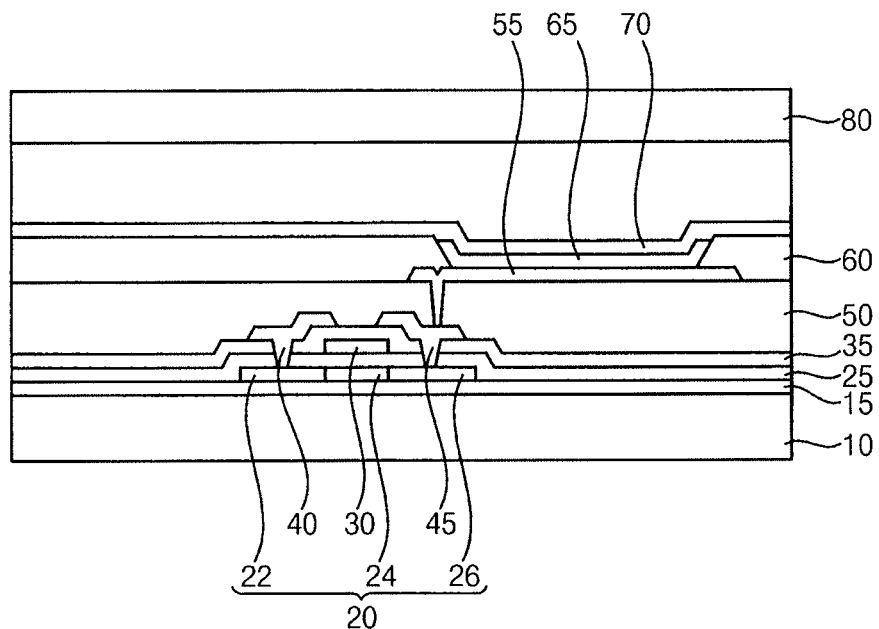
FIG. 2 illustrates a cross-sectional view depicting a display structure of an organic light emitting display device in accordance with example embodiments.

FIG. 2 illustrates a cross-sectional view depicting an organic light emitting display device including a display structure in accordance with example embodiments.

As illustrated in FIG. 2, the display structure 120 may be disposed between a first substrate 10 and a second substrate 80. The display structure 120 may include a switching element, an organic light emitting element, wirings, insulation layers, etc. The organic light emitting element may include a first electrode 55, an organic light emitting element 65, a second electrode 70, etc.

A buffer layer 15 may be disposed on the first substrate 10. The first substrate 10 may include a transparent insulation material. For example, the first substrate 10 may include a glass substrate, a quartz substrate, a transparent resin substrate, etc.

The buffer layer 15 may prevent the diffusion of metal atoms and/or impurities from the first substrate 10. Additionally, the buffer layer 10 may adjust a heat transfer rate in a successive crystallization process for an active pattern 20, to thereby obtaining a substantially uniform active pattern 20. If the first substrate 10 has a relatively irregular surface, the buffer layer 10 may improve a flatness of the surface of the first substrate 10. The buffer layer 15 may be formed using a silicon compound.

The switching element may be disposed on the buffer layer 15. The switching element may include a thin film transistor (TFT) having the active pattern 20, which may contain silicon (Si). For example, the switching element may include the active pattern 20, a gate insulation layer 25, a gate electrode 30, a source electrode 40, a drain electrode 45, etc. In other implementations, the switching element may be an oxide semiconductor device having an active pattern that contains semiconductor oxide.

When the switching element includes the TFT, the active pattern may be disposed on the buffer layer 15. The active pattern 20 may have a source region 22 and a drain region 24, both of which may be doped with impurities. The active pattern 20 may additionally include a channel region 26 provided between the source region 22 and the drain region 24.

The gate insulation layer 25 may be disposed on the buffer layer 15 to cover the active pattern 20. The gate insulation layer 25 may include silicon oxide, metal oxide, etc. Examples of metal oxide for the gate insulation layer 25 may include hafnium oxide ($HfO_x$), aluminum oxide ($AlO_x$), zirconium oxide ($ZrO_x$), titanium oxide ($TiO_x$), tantalum oxide ($TaO_x$), etc. These may be used alone or in a combination thereof.

The gate electrode 30 may be located on the gate insulation layer 25. For example, the gate electrode 30 may be positioned on a portion of the gate insulation layer 25 under which the active pattern 20 is located. The gate electrode 30 may include metal, alloy, conductive metal oxide, a transparent conductive material, etc. For example, the gate electrode 30 may be formed using aluminum (Al), an alloy containing aluminum, aluminum nitride ($AlN_x$), silver (Ag), an alloy containing silver, tungsten (W), tungsten nitride ($WN_x$), copper (Cu), an alloy containing copper, nickel (Ni), an alloy containing nickel, chromium (Cr), chromium nitride ($CrN_x$), molybdenum (Mo), alloy containing molybdenum, titanium (Ti), titanium nitride (TiNx), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in a combination thereof. A gate line may be disposed on the gate insulation layer 25. The gate electrode 30 may be electrically connected to the gate line. The gate line may extend along a first direction on the gate insulation layer 25.

An insulating interlayer 35 may be disposed on the gate insulation layer 25 to cover the gate electrode 30. The insulating interlayer 35 may electrically insulate the source and the drain electrodes 40 and 45 from the gate electrode 30. The insulating interlayer 35 having a substantially uniform thickness may be conformally formed on the gate insulation layer 25 along a profile of the gate electrode 30. The insulating interlayer 35 may be formed using a silicon compound. For example, the insulating interlayer 35 may include silicon oxide, silicon nitride, silicon oxynitride, silicon oxycarbide, and/or silicon carbon nitride. These may be used alone or in a mixture thereof.

As illustrated in FIG. 2, the source electrode 40 and the drain electrode 45 may be disposed on the insulating interlayer 35. The source and the drain electrodes 40 and 45 may be separated each other substantially centering the gate electrode 30 by a predetermined distance. The source and the drain electrodes 40 and 45 may pass through the insulating interlayer 35, and may make contact with the source and the drain regions 22 and 24, respectively. Each of the source and the drain electrodes 40 and 45 may include metal, alloy, metal nitride, conductive metal oxide, a transparent conductive material, etc. For example, the source and the drain electrodes 40 and 45 may be formed using aluminum, an alloy containing aluminum, aluminum nitride, silver, an alloy containing silver, tungsten, tungsten nitride, copper, an alloy containing copper, nickel, an alloy containing nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium oxide, indium tin oxide, tin oxide, indium oxide, gallium oxide, indium zinc oxide, etc. These may be used alone or in a combination thereof. A data line may be formed on the insulating interlayer 35 while forming the source and the drain electrodes 40 and 45. The data line may extend on the insulating interlayer 35 along a second direction. In this case, the second direction of the date line may be substantially perpendicular to the first direction of the gate line.

With the formation of the source and the drain electrodes 40 and 45 on the insulating interlayer 35, the switching device may be provided on the first substrate 10. The switching device may include the TFT, which may have the active pattern 20, the gate insulation layer 25, the gate electrode 30, the source electrode 40, and the drain electrode 45.

An insulation layer 50 may be disposed on the insulating interlayer 35. The insulation layer 50 may be formed using an organic material. For example, the insulation layer 50 may include a photoresist, an acryl-based resin, a polyimide-based resin, a polyamide-based resin, a siloxane-based resin, etc. These may be used alone or in a combination thereof. In other implementations, the insulation layer 50 may include an inorganic material. For example, the insulation layer 50 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in a mixture thereof.

Referring now to FIG. 2, the first electrode 55 may be located on the insulation layer 50 and may make contact with the drain electrode 45 through the insulation layer 50. The first electrode 55 may include a reflective material or a transmissive material. For example, the first electrode 55 may be formed using aluminum, an alloy containing aluminum, aluminum nitride, silver, an alloy containing silver, tungsten, tungsten nitride, copper, an alloy containing copper, nickel, an alloy containing nickel, chromium, chromium nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the first electrode 55 may receive holes or electrons from the adjacent solar cells 130 (see FIG. 1) in accordance with a type of the organic light emitting display device 100.

A pixel defining layer 60 may be disposed on the first electrode 55 and the insulation layer 50. The pixel defining layer 60 may include an organic material or an inorganic material. For example, the pixel defining layer 60 may be formed using a photoresist, an acryl-based resin, a polyacryl-based resin, a polyimide-based resin, a silicon compound, etc. In example embodiments, the pixel defining layer 60 may have an opening partially exposing the first electrode 55.

The organic light emitting element 65 may be positioned on the first electrode 55 exposed by the opening of the pixel defining layer 60. The organic light emitting element 65 may extend on a sidewall of the opening of the pixel defining layer 60. In example embodiments, the organic light emitting element 65 may include an organic light emitting layer (EL), a hole injection layer (HIL), a hole transfer layer (HTL), an electron transfer layer (ETL), an electron injection layer (EIL), etc. For example, a plurality of organic light emitting layers may be stacked on the first electrode 55 using light emitting materials for generating different colors of light such as a red color of light (R), a green color of light (G), and a blue color of light (B) in accordance with color pixels of the organic light emitting display device 100. In some example embodiments, the organic light emitting layer of the of the organic light emitting element 65 may include a plurality of stacked light emitting materials for generating a red color of light, a green color of light, and a blue color of light to thereby emit a white color of light.

The second electrode 70 may be disposed on the organic light emitting element 65 and the pixel defining layer 60. The second electrode 70 may include a transmissive material or a reflective material in accordance with the type of the organic light emitting display device 100. For example, the second electrode 70 may be formed using aluminum, an alloy containing aluminum, aluminum nitride, silver, an alloy containing silver, tungsten, tungsten nitride, copper, an alloy containing copper, nickel, an alloy containing nickel, chromium, chromium, nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the second electrode 70 may receive holes or electrons from the adjacent solar cells 130 (see FIG. 1) in accordance with the type of the organic light emitting display device 100.

The second substrate 80 may be positioned on the second electrode 70. The second substrate 80 may include a transparent insulation substrate. For example, the second substrate 80 may be a glass substrate, a quartz substrate, a transparent resin substrate, etc. In example embodiments, a predetermined space may be provided between the second electrode 70 and the second substrate 80. This space may be filled with an air or an inactive gas such as a nitrogen ($N_2$) gas.

FIGS. 3 through 6 illustrate cross-sectional views depicting stages of a method of manufacturing an organic light emitting display device in accordance with example embodiments.

Figure 3:
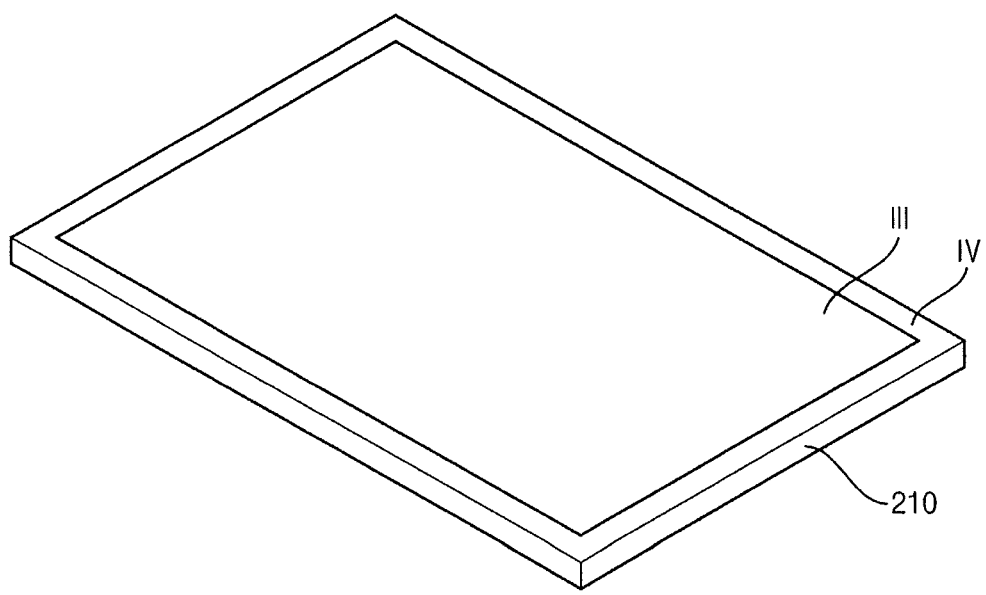
FIGS. 3 through 6 illustrate cross-sectional views depicting stages of a method of manufacturing an organic light emitting display device in accordance with example embodiments.

Referring to FIG. 3, a first substrate 210 may include a display region III and a peripheral region IV adjacent to the display region III. For example, the peripheral region IV may substantially surround the display region III. In other implementations, a position of the display region III relative to the peripheral region IV may vary in accordance with a configuration of the organic light emitting display device. The first substrate 210 may be formed using a transparent insulation material. For example, the first substrate 210 may be a glass substrate, a quartz substrate, a transparent resin substrate, etc.

Figure 4:
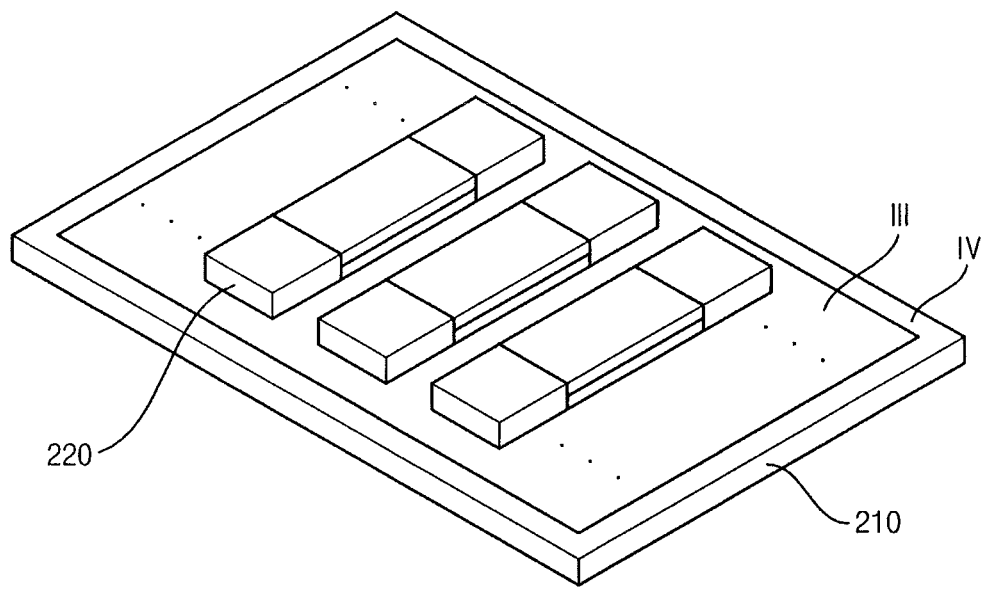

Referring to FIG. 4, a plurality of display structures 220 may be formed in the display region III. Each of the display structures 220 may include a switching element, an insulation layer, an organic light emitting element, etc. In other implementations, each display structure 220 may include a liquid crystal element instead of the organic light emitting element. In example embodiments, the display structures 220 may have configurations substantially the same as or substantially similar to those of the display structures 120 of FIG. 2.

Figure 5:
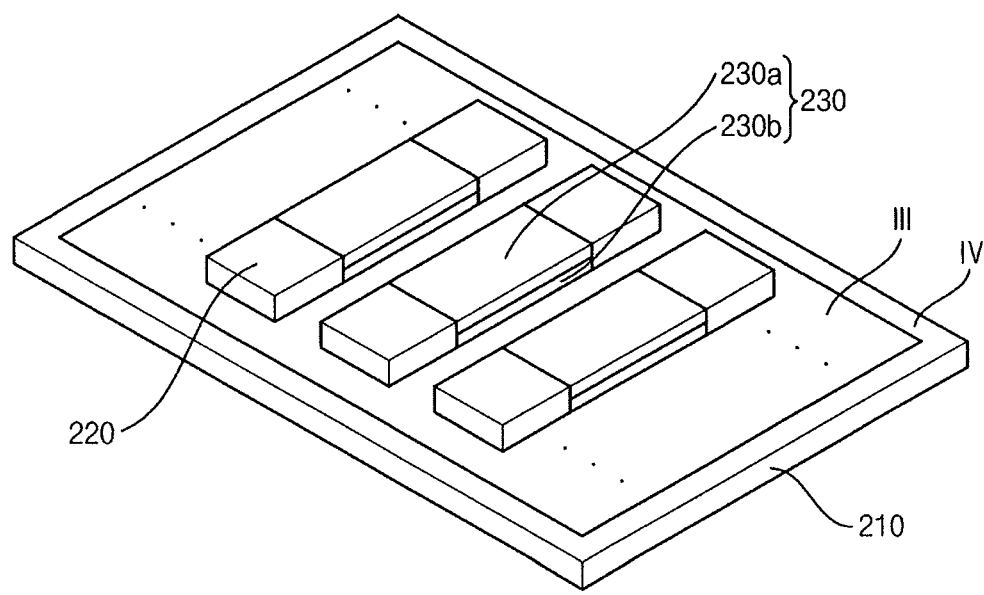

Referring to FIG. 5, a plurality of solar cells 230 may be formed in the display region III. In example embodiments, each of the solar cells 230 may be formed among the organic light emitting elements. For example, each solar cell 230 may be at least one of an organic thin film solar cell, a compound semiconductor solar cell, and a dye-sensitized solar cell. The solar cells 230 may be formed in the display region III of the first substrate 210 on which the display structures 220 are disposed using an adhesive member (e.g., a sealant, an adhesive tape, etc.). When the display structures 220 and the solar cells 230 are formed by separate processes, manufacturing efficiency of the organic light emitting display device may be improved. Accordingly, defects of the organic light emitting display device may be decreased and the yield of the organic light emitting display device may be improved.

In example embodiments, each of the solar cells 230 may include a first solar cell pattern 230*a* and a second solar cell pattern 230*b*. The first solar cell pattern 230*a* and the second solar cell pattern 230*b* may have structures substantially the same as or substantially similar to those of the first solar cell pattern 130*a* and the second solar cell pattern 130*b* in FIG. 1, respectively.

Figure 6:
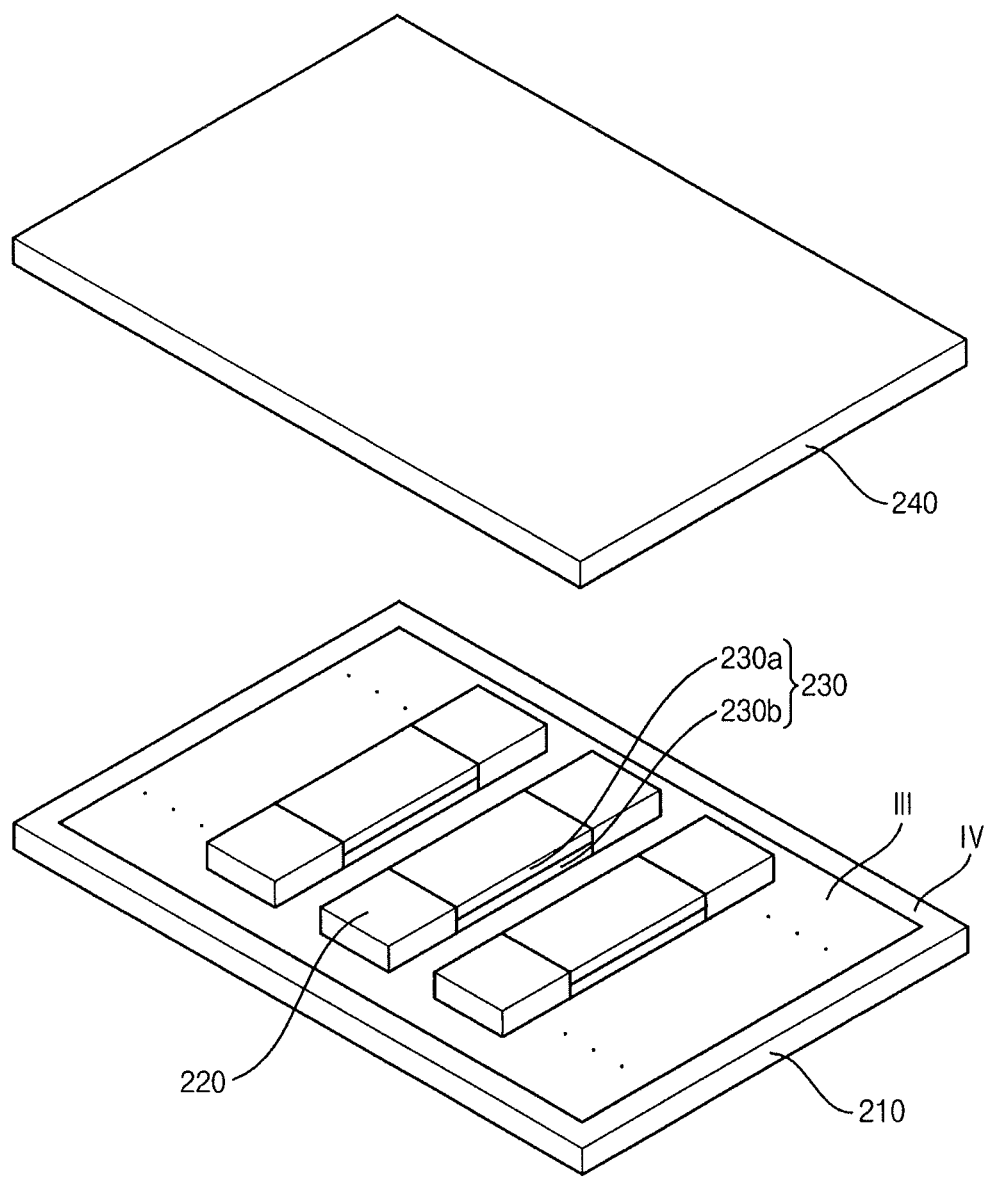

Referring to FIG. 6, a second substrate 240 may be formed over the first substrate 210. The second substrate 240 may be substantially opposed to the first substrate 210. The second substrate 240 may be formed using a transparent material. For example, the second substrate 240 may include a glass substrate, a quartz substrate, a transparent resin substrate, etc.

Upon formation of the second substrate 240, the organic light emitting display device may be obtained. The organic light emitting display device may have a configuration substantially the same as or substantially similar to that of the organic light emitting display device 100 described with reference to FIG. 1.

Figure 7:
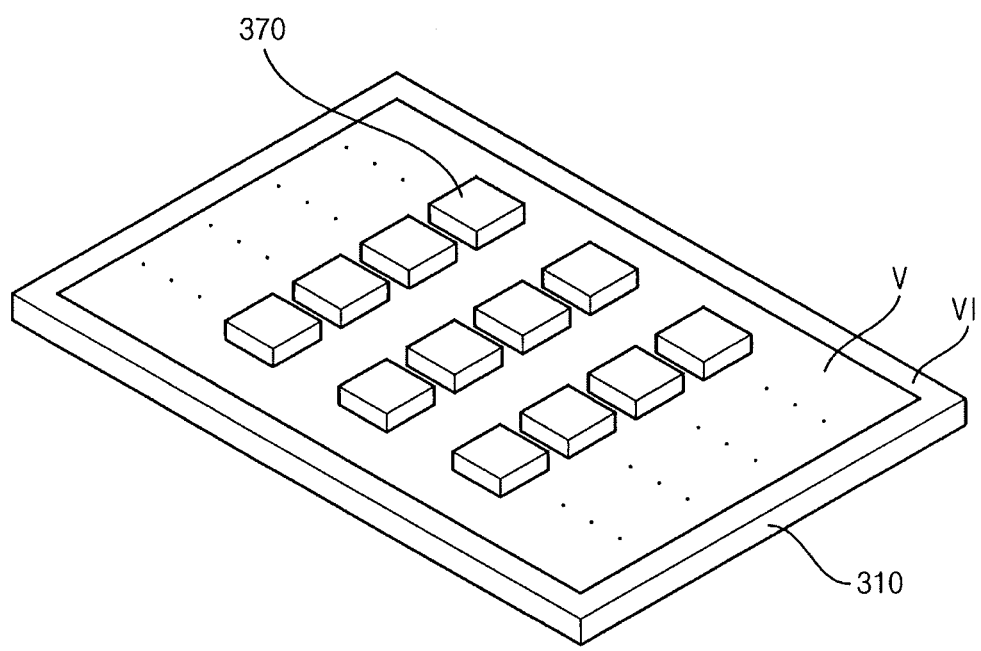
FIG. 7 illustrates an exploded perspective view depicting an organic light emitting display device in accordance with some example embodiments.
Figure 8:
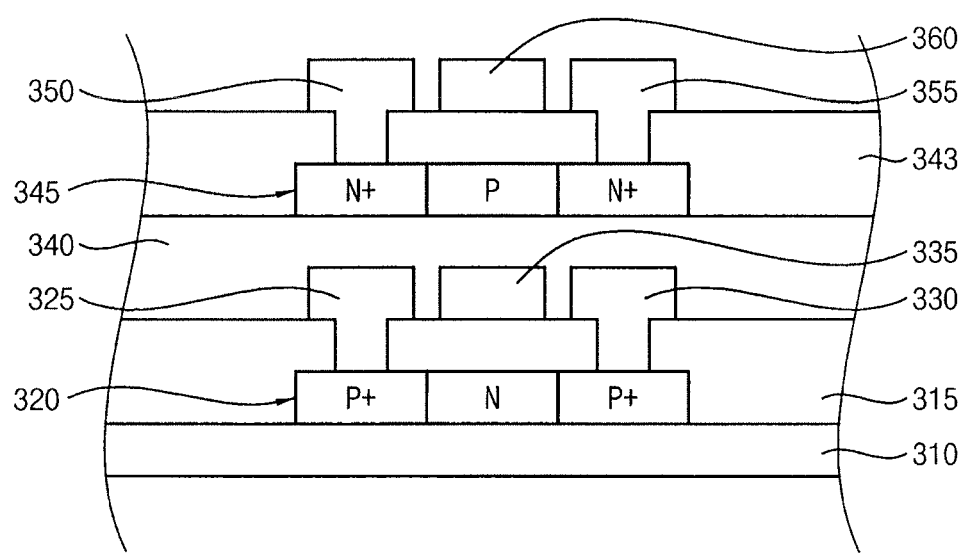
FIG. 8 illustrates a cross-sectional view depicting switching elements of a display structure in accordance with some example embodiments.

FIG. 7 illustrates an exploded perspective view depicting an organic light emitting display device in accordance with some example embodiments, and FIG. 8 illustrates a cross-sectional view depicting switching elements of a display structure in accordance with some example embodiments. The organic light emitting display device 300 in FIG. 7 may have a configuration substantially the same as or substantially similar to that of the organic light emitting display device 100 in FIG. 1 except display structures 370.

Referring to FIG. 7, the organic light emitting display device 300 may include a first substrate 310 having a display region V and a peripheral region VI adjacent to the display region V, a plurality of display structures 270, a second substrate 380, etc. The display structures 270 may include a plurality of switching elements and a plurality of organic light emitting elements. The switching elements may be located in the display region V and may have channels of different types. The organic light emitting elements may be electrically connected to the switching elements. For example, the switching elements of each display structure 370 may have substantially stacked structures, respectively. Additionally, each of the display structures 370 may have a configuration substantially the same as or substantially similar to that of the display structure 120 described with reference to FIG. 2.

As illustrated in FIG. 8, each of the display structures 370 may include a first switching element that has an n-type channel and is located on the first substrate 310, and a second switching element that has a p-type channel and is located over the first switching element. For example, the first switching elements may correspond to an N-MOSFET and the second switching elements may correspond to a P-MOSFET.

In example embodiments, the first switching element may include a first gate insulation layer 315, a first active pattern 320, a first gate electrode 335, a first source electrode 325, a first drain electrode 330, etc. Additionally, the second switching element may include a second gate insulation layer 343, a second active pattern 345, a second gate electrode 360, a second source electrode 350, a second drain electrode 355, etc.

An insulation interlayer 340 may be disposed between the first switching element and the second switching element. The first active pattern 320 of the first switching element may include a first source region, a first drain region and a first channel region. The second active pattern 345 of the second switching element may include a second source region, a second drain region, and a second channel region. For example, the first source region and the first drain region may include p-type impurities, and the first channel region may correspond to an n-type doping region. The second source region and the second drain region may include n-type impurities, and the second channel region may correspond to a p-type doping region.

When the first switching element includes the first channel and the second switching element includes the second channel, the organic light emitting display device 300 may include a p-n junction formed between the first switching element and the second switching element. When the p-n junction receives light incident from an outside and/or light emitted from the organic light emitting elements, a current may flow through the p-n junction. The p-n junction may serve as an internal power source of the organic light emitting display device 300. For example, the p-n junction between the first switching elements and the second switching element may convert light incident from the outside and/or light emitted from the organic light emitting elements into electric energy. An external power source may receive the electric energy from the p-n junction, and then the electric energy may be provided to first electrodes of the organic light emitting elements and/or second electrodes of the organic light emitting elements. The organic light emitting display device 300 may autonomously generate the electric energy without using the external power source. Instead, the organic light emitting display device 300 may use the internal power source (i.e., the p-n junctions formed between the first switching elements and the second switching elements). As a result, the organic light emitting display device 300 may have low power consumption. The dimensions and the types of the first and the second switching elements in the display region V may vary, such that the organic light emitting display device 300 may have reduced dimensions such as a relatively thin thickness, a relatively light weight, etc.

Figure 9:
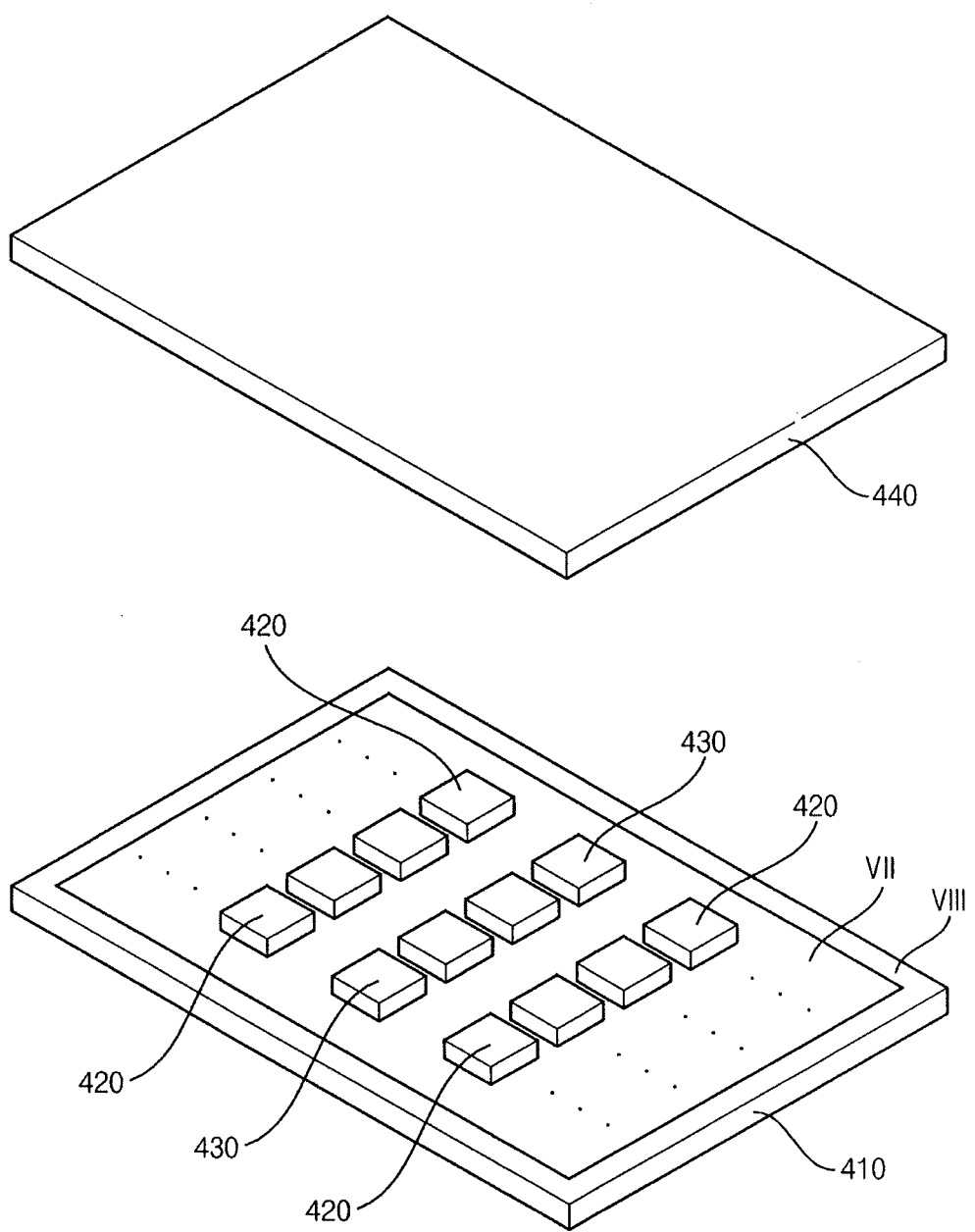
FIG. 9 illustrates an exploded perspective view depicting an organic light emitting display device in accordance with other example embodiments.
Figure 10:
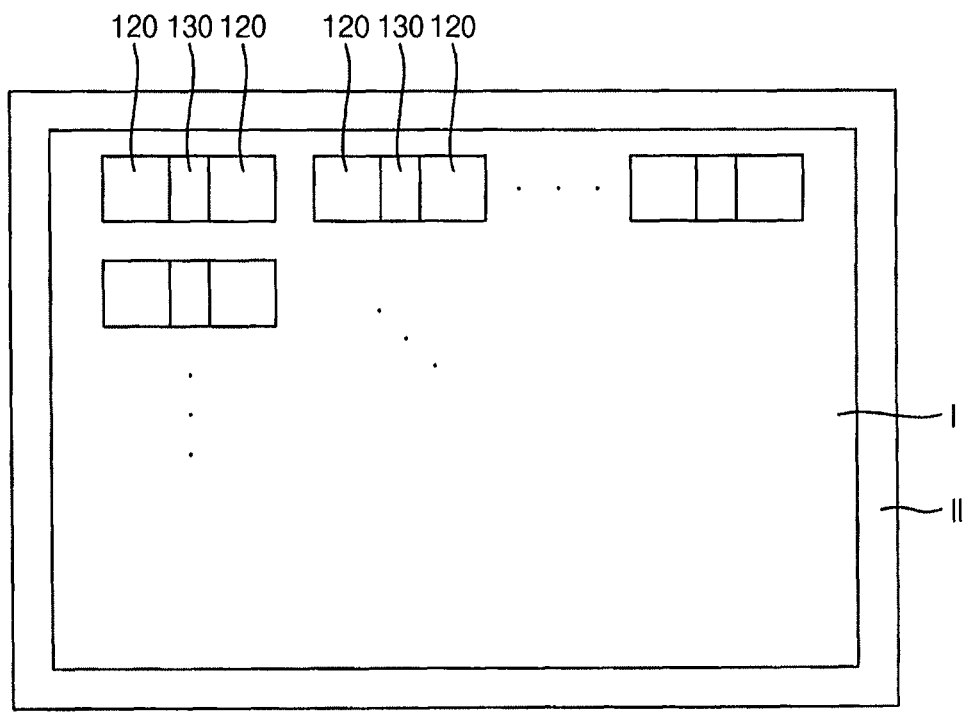
FIG. 10 schematically illustrates a plan view depicting an arrangement of solar cells and display structures on a first substrate according to an embodiment.

FIG. 9 illustrates an exploded perspective view depicting an organic light emitting display device in accordance with other example embodiments. The organic light emitting display device 400 in FIG. 9 may have a configuration substantially the same as or substantially similar to that of the organic light emitting display device 100 in FIG. 1 except for the presence of first and second display structures 420 and 430.

Referring to FIG. 9, the organic light emitting display device 400 may include a first substrate 410, a plurality of first display structures 420, a plurality of second display structures 430, a second substrate 440, etc.

Referring to FIG. 9, the first substrate 410 having a display region VII and a peripheral region VIII may include a transparent insulation material. For example, the first substrate 410 may include a glass substrate, a quartz substrate, a transparent resin substrate, etc. Additionally, the second substrate 440 may include a transparent insulation material.

The first display structures 430 may be disposed in the display region VII of the first substrate 410. For example, the first display structures 430 may be arranged along a first direction in the display region VII. The first display structures 430 may include a plurality of switching elements and a plurality of organic light emitting elements electrically connected to the switching elements, respectively. In example embodiments, the switching elements of the first display structures 430 may have configurations substantially the same as or substantially similar to those of the switching elements described with reference to FIG. 2.

The second display structures 430 may be also disposed in the display region III of the first substrate 410. The second display structures 430 may be spaced apart from the first display structures 420 and may be arranged along a second direction substantially parallel to the first direction. For example, the first display structures 420 and the second display structures 430 may be alternately disposed along a row direction in the display region VII. The second display structures 430 may include first switching elements and second switching elements that have configurations substantially the same as or substantially similar to those of the first and the second switching elements described with reference to FIG. 8. Additionally, the second display structures 430 may include second organic light emitting elements having configurations substantially the same as or substantially similar to those of the second organic light emitting element described with reference to FIG. 2. In example embodiments, the organic light emitting display device 400 may include p-n junctions. Here, the p-n junctions may be respectively formed between the first switching elements and the second switching elements, and may be used as internal power sources of the organic light emitting display device 400. Accordingly, the organic light emitting display device 400 may provide an improved portability, an enhanced usability, and lower power consumption. Additionally, the organic light emitting display device 400 may have decreased dimensions including a relatively thin thickness and a relatively light weight.

In some example embodiments, the organic light emitting display device 400 may have a configuration in which the first display structures and the second display structures are alternately disposed along a column direction. Here, the first display structures or the second display structures may include first switching elements and second switching elements substantially the same as or substantially similar to the first and the second switching elements described with reference to FIG. 8. In some example embodiments, the organic light emitting display device 400 may have a configuration in which the first display structure and the second display structure include different switching elements. For example, the first display structure and the second display structure may have switching elements having different configurations. In this case, the first display structures and the second display structures may be adjacent to one another along a predetermined direction. For example, one of the first display structure and the second display structure may include a first switching element and a second switching element substantially the same as or substantially similar to the first switching element and the second switching element described with reference to FIG. 8.

The organic light emitting display device according to example embodiments may be employed in an electronic device where portability, usability, and lower power consumption are desired. For example, the organic light emitting display device according to embodiments may be used in a notebook computer, a laptop computer, a digital camera, a video camcorder, a cellular phone, a smart phone, a smart pad, a portable multimedia player (PMP), a personal digital assistant (PDA), a MP3 player, a navigation system, a television, a computer monitor, a game console, a video phone, etc.

By way of summation and review, an organic light emitting display device may operate using power provided from an external power source, such as a battery. However, the external power source may need to be periodically replaced because the type of the external power source and/or the power provided from the external power source may be consumed over time. Thus, portability and usability of the organic light emitting display device may be reduced. Additionally, it may be difficult to improve the power consumption of the organic light emitting display device. Although the organic light emitting display device may have internal power sources (e.g., power saving circuits) in a peripheral region thereof, dimensions of the internal power sources and the number of the internal power sources may be confined when the internal power sources are disposed only in the peripheral region of the organic light emitting display device. Further, thickness and weight of the organic light emitting display device may not be desirably reduced because of the internal power sources.

Example embodiments provide an organic light emitting display device including the internal power sources to ensure lower power consumption and to reduce dimensions such as thickness, weight, etc.

According to example embodiments, the organic light emitting display device may include the solar cells or the switching elements as the internal power sources thereof. The solar cells may be disposed among the organic light emitting elements in the display region, and the switching elements may include channels having different conductivity types. Accordingly, the solar cells may convert light incident from the outside to the electric energy and/or light emitted from the organic light emitting elements into electric energy. The electric energy from the external power sources may be provided to the first electrodes of the organic light emitting elements and/or the second electrodes of the organic light emitting elements. An external power source may be continuously conserved by using the internal power sources (i.e., the solar cells and/or the p-n junctions). Accordingly, the organic light emitting display device may be sequentially used without replacing the external power source. Thus, the organic light emitting display device may have lower power consumption and improved portability and usability. Additionally, the solar cells may provide holes and/or electrons to the first electrodes of the organic light emitting elements and/or the second electrodes of the organic light emitting elements. The organic light emitting display device may autonomously generate electric energy without the external power source because the organic light emitting display device may use the solar cells and/or the p-n junctions as the internal power sources thereof. As a result, the organic light emitting display device may have a low power consumption, and also may have reduced dimensions such as a thin thickness and a light weight because the solar cells and/or the p-n junctions may be disposed in portions of the display region such as portions of the display region among the organic light emitting elements.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting display device, comprising:
    a first substrate having a display region and a peripheral region adjacent to the display region;
    a plurality of display structures in the display region, the display structures including a plurality of switching elements and a plurality of organic light emitting elements;
    a plurality of solar cells adjacent to the organic light emitting elements in the display region;
    a second substrate opposed to the first substrate,
    wherein each of the solar cells includes:
    a first solar cell pattern having an n-type semiconductor that is electrically connected to a first electrode of an adjacent organic light emitting element and the first electrode is electrically connected to a drain electrode of an adjacent switching element of the plurality of switching elements;
    a second solar cell pattern having a p-type semiconductor that is electrically connected to a second electrode of the adjacent organic light emitting element;
    wherein a p-n junction between the first solar cell pattern and the second solar cell pattern converts at least one of light incident from an outside and light emitted from the organic light emitting elements into electric energy, and
    wherein the organic light element is interposed between the first electrode and the second electrode and the organic light element extends on a sidewall of an opening of a pixel defining layer.

2. The organic light emitting display device as claimed in claim 1, one solar cell is located between two adjacent organic light emitting elements.

3. The organic light emitting display device as claimed in claim 1, wherein the number of organic light emitting elements is the same as the number of the solar cells.

4. The organic light emitting display device as claimed in claim 1, one solar cell is located among three or more adjacent organic light emitting elements.

5. The organic light emitting display device as claimed in claim 1, wherein each of the solar cells has a sheet shape.

6. The organic light emitting display device as claimed in claim 1, wherein each of the solar cells includes at least one selected from the group of an organic thin film solar cell, a compound semiconductor solar cell, and a dye-sensitized solar cell.

7. The organic light emitting display device as claimed in claim 1, wherein each of the switching elements includes channels having the same conductivity type.

\* \* \* \* \*